(12) United States Patent
Yeh et al.

(10) Patent No.: US 7,482,185 B2
(45) Date of Patent: Jan. 27, 2009

(54) VERTICAL PIXEL STRUCTURES FOR EMI-FLECTIVE DISPLAY AND METHODS FOR MAKING THE SAME

(75) Inventors: Yung-Hui Yeh, Hsinchu (TW); Yu-Wu Wang, Hsinchu County (TW); Yu-Lung Liu, Kaohsiung (TW); Chi-Chang Liao, Tainan (TW); Hsing-Lung Wang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 429 days.

(21) Appl. No.: 11/306,549

(22) Filed: Jan. 2, 2006

(65) Prior Publication Data

US 2007/0032000 A1 Feb. 8, 2007

(30) Foreign Application Priority Data

Aug. 3, 2005 (TW) .............................. 94126311 A

(51) Int. Cl.
*H01L 21/00* (2006.01)
(52) U.S. Cl. ........................... 438/29; 438/30; 438/149; 257/E29.151; 345/92

(58) Field of Classification Search ......... 438/149–167, 438/29, 30; 257/E59.022, E29.151; 345/92
See application file for complete search history.

(56) References Cited

U.S. PATENT DOCUMENTS

| 6,046,790 | A | * | 4/2000 | Hara et al. ................. 349/172 |
| 6,162,654 | A | * | 12/2000 | Kawabe ....................... 438/30 |
| 6,714,268 | B2 | | 3/2004 | Wang et al. ................... 349/48 |
| 2003/0193457 | A1 | * | 10/2003 | Wang et al. ................... 345/84 |
| 2004/0164292 | A1 | | 8/2004 | Tung et al. .................... 257/40 |

FOREIGN PATENT DOCUMENTS

WO WO 2004/077137 9/2004

\* cited by examiner

*Primary Examiner*—Brook Kebede
(74) *Attorney, Agent, or Firm*—Jianq Chyun IP Office

(57) ABSTRACT

A vertical pixel structure for emi-flective display and a method thereof are provided. The vertical pixel structure has a substrate, a emitting pixel unit arranged on the substrate and a reflective pixel unit arranged on the emitting pixel unit. By using the vertical pixel structure the aperture of the display can be increased, and the power consumption can be reduced as well.

30 Claims, 10 Drawing Sheets

VERTICAL PIXEL STRUCTURES FOR EMI-FLECTIVE DISPLAY AND METHODS FOR MAKING THE SAME

CROSS-REFERENCE TO RELATED APPLICATION

This application claims the priority benefit of Taiwan application serial no. 94126311, filed on Aug. 3, 2005. All disclosure of the Taiwan application is incorporated herein by reference.

BACKGROUND OF THE INVENTION

1. Field of the Invention

The present invention relates to pixel structures of a display, and more particularly to a vertical pixel structure for an emi-flective (emitting-reflective) display and a fabricating method thereof.

2. Description of Related Art

FIG. 1 illustrates a pixel structure for a conventional emissive-reflective (emi-flective) display. The pixel structure includes a substrate 10, a self-light emitting pixel unit 14, a reflective pixel unit 12, and a transparent cover layer 16. The pixel structure is a horizontal type. Namely, the self-emitting pixel unit 14 and the reflective pixel unit 12 are disposed on the left and right sides of the same plane. As a result, the aperture of the display cannot be increased, and therefore, the image quality of the display is decreased.

When the conventional horizontal emi-flective display is used, its power consumption is higher because a backlight module is also required for half transmissive mode. At the same time, because of having a horizontal structure, the aperture of the display cannot be increased. Currently most displays having a combination of the emitting and reflective types primarily adopt a horizontal or coplanar half-reflective and half-transmissive structure, such as disclosures in US Patent No. 20040164292 A1 and World Patent No. 04077137A1. In addition, the self-light emitting element is used as a back light for the half reflective and half transmissive display. However, the aforementioned display has a problem that its aperture cannot be increased. Furthermore, U.S. Pat. No. 6,714,268B2 discloses a horizontal display using a self-light emitting element as the back light for a half-reflective and half-transmissive type display. This structure also has drawbacks of low aperture and high power consumption.

Therefore, it is very important how to provide an effective pixel structure to increase the aperture and lower the power consumption.

SUMMARY OF THE INVENTION

An object of the present invention is to provide a pixel structure for a vertical emissive-reflective (emi-flective) display that can solve lower aperture and high power consumption of the conventional horizontal emi-flective display.

Another object of the present invention is to provide a pixel structure for a vertical emi-flective display and a method thereof that are compatible with the current manufacturing processes for thin film transistor (TFT) array, organic light-emitting diode (OLED) and liquid crystal. Therefore, no additional masks are required and the cost can be decreased.

Another object of the present invention is to provide a pixel structure for a vertical emi-flective display and a method thereof. The method requires no wet processing, and therefore the yield can be increased.

According to the above objects, the present invention provides a pixel structure for a vertical emi-flective display. The pixel structure comprises a first substrate, a switch layer, a first insulating layer, a second insulating layer, a conductive layer, a self-light emitting device layer, a cathode layer, a third insulating layer, a reflective-type display unit module layer, and a second substrate. The switch layer is disposed on the first substrate, and comprises a first, a second and a third switch elements. Each of the switch elements comprises a channel region, a source and a drain. The first insulating layer is disposed on the switch layer, and the second insulating layer is disposed on the first insulating layer and exposes a portion of the first insulating layer. The conductive layer is disposed on the exposed first insulating layer, and divided into a common electrode layer, an anode layer and a cathode connecting layer. The anode layer is electrically connected to the drain of the second switch element and the cathode connecting layer is electrically connected to the drain of the third switch element. The self-light emitting device layer is disposed on the anode layer of the conductive layer. The cathode layer is disposed on the self-light emitting device layer and is electrically connected to the cathode connecting layer. The third insulating layer is disposed on the second insulating layer and the cathode layer, and exposes the common electrode layer. The reflective-type display unit module layer is disposed on the third insulating layer. The second substrate is disposed on the reflective-type display unit module layer.

In the foregoing vertical pixel structure, the switch layer further comprises a buffer layer, a channel layer, a gate electrode layer, a gate oxide layer, an interlayer dielectric layer and a plurality of source/drain electrodes. The channel layer is disposed on the buffer layer, divided into channels of the first, the second and the third switch elements. Each of the channels comprises a channel region, a source and a drain. The gate electrode layer comprises a plurality of gate electrodes respectively located above or below the channel regions. The gate oxide layer is disposed between the gate electrode layer and the channel layer. The interlayer dielectric layer is disposed on the channel layer and the gate electrode layer. The source/drain electrodes are disposed on the interlayer dielectric layer and are electrically connected to the sources and the drains of the first, the second and the third switch elements, respectively.

In the foregoing vertical pixel structure, the reflective-type display unit module layer can be a reflective liquid crystal display module layer, further including a liquid crystal layer, a color filter layer, a transparent electrode layer. The liquid crystal layer is disposed on the third insulating layer. The color filter layer is disposed on the liquid crystal layer. The transparent electrode layer is disposed between the second substrate and the color filter layer and is electrically connected to the common electrode layer.

According to one embodiment, the present invention further provides a full-color pixel structure for a vertical emi-flective display. The pixel structure comprises a first substrate, a switch array layer, an anode layer, an insulating layer, a self-light emitting device layer, a cathode layer, a passivation layer, a reflective liquid crystal display module layer and a second substrate. The switch array layer is disposed on the first substrate. Each sub-pixel corresponding to the full-color pixel respectively comprises a first, a second and a third switch element, and each switch element has a gate, a source and a drain. The anode layer is disposed on the switch array layer, including a first anode, a second anode and a third anode. The first, the second and the third anodes are electrically connected to the drains of the corresponding second switch elements, respectively. The insulating layer is disposed on the switch array layer and the anode layer, and the insulating layer is further patterned to expose the first, the second and the third anodes, and electrically isolates the first, the second and the third anodes from each other. The self-light emitting device layer comprises a first self-light emitting device unit, a second self-light emitting device unit, a third self-light emitting device unit respectively disposed on the first anode, the second anode and the third anode. The cathode layer is disposed on the self-light emitting device layer, and the insulating layer comprises a first cathode, a second cathode and a third cathode electrically connected to the drains of the corresponding third switch elements. The passivation layer is disposed on the cathode layer, for electrically isolating the first cathode, the second cathode and the third cathode from each other. The reflective-type display unit module layer is disposed on the passivation layer. The second substrate is disposed on the reflective-type display unit module layer.

In the foregoing full-color pixel structure, the reflective-type display unit module layer can be a reflective liquid crystal module layer, and further comprises a liquid crystal layer, disposed on the passivation layer; a color filter layer, disposed on the liquid crystal layer and including a first color filter, a second color filter and a third color filter, respectively aligned with the first self-light emitting device unit, the second self-light emitting device unit and the third self-light emitting device unit; and a transparent electrode, disposed between the color filter layer and the second substrate and electrically connected to the common electrode.

In addition, the present invention further provides a method for manufacturing a pixel structure for a vertical emi-flective display. The method comprises following steps. A first substrate and a second substrate are provided, and a switch layer is formed on the first substrate. The switch layer comprises a first, a second and a third switch elements, and each of the switch elements comprises a channel region, a source and a drain. A first insulating layer is formed on the switch layer, and a conductive layer is formed on the first dielectric layer. The conductive layer is further patterned to expose a portion of the first insulating layer, and the remaining conductive layer is divided into a common electrode layer, an anode layer and a cathode connecting layer. A second insulating layer is formed on the exposed first insulating layer. A self-light emitting device layer is then formed on the anode layer. A cathode layer is formed on the self-light emitting device layer and the cathode connecting layer, and the cathode layer is electrically connected to the cathode connecting layer. A third insulating layer is formed on the second insulating layer and the cathode layer, and then the third insulating layer is further patterned to expose the common electrode layer. A reflective-type display unit module layer is formed on the second substrate, and then the reflective-type display unit module layer together with the second substrate is placed on the third insulating layer.

Furthermore, the present invention provides a method for manufacturing a full-color pixel structure for a vertical emi-flective display. The method comprises following steps. A first substrate is provided and a switch array layer is formed on the first substrate. Each of sub-pixels corresponding to one full-color pixel further comprises a first switch, a second and a third switch elements, and each switch element has a gate, a source and a drain. Then, an anode layer is formed on the switch array layer, and is further patterned to form a first anode, a second anode and a third anode. The first, the second and the third anodes are electrically connected to drains of the corresponding second switch elements, respectively. An insulating layer is formed on the switch array layer and the anode layer for electrically isolating the first, the second and the third anodes from each other, and the anodes are exposed by the insulating layer. Then, a self-light emitting device layer is formed on the first, the second and the third anode, and divided into a first self-light emitting device unit, a second self-light emitting device unit and a third self-light emitting device unit. A cathode layer is formed on the self-light emitting device layer and the dielectric layer, and the cathode layer is further patterned to form a first, a second and a third cathodes. These cathodes are electrically connected to drains of the corresponding third switch elements. A passivation layer is formed on the cathode layer for electrically isolating the first, the second and the third cathodes from each other. Thereafter, a liquid crystal layer is formed on the passivation layer, and a color filter layer is formed on the liquid crystal layer. The color filter layer further comprises a first color filter, a second color filter and a third color filter, respectively aligned with the first self-light emitting device unit, the second self-light emitting device unit and the third self-light emitting device unit. A transparent electrode layer is formed on the color filter layer and is electrically connected to the common electrode. A second substrate is formed on the transparent electrode.

In the foregoing pixel structures or the methods thereof, the first, the second and the third switch elements can be organic TFTs, low temperature polysilicon (LTPS) TFTs, amorphous silicon TFTs, silicon-based TFTs, microcrystalline silicon TFTs or transparent TFTs.

The foregoing first substrate and second substrate can be flexible substrates. The first and the second substrates can be glass substrates, metal foil substrates, plastic substrates or silicon-based substrates.

In the foregoing vertical pixel structures and the methods thereof, the material of the buffer layer can be silicon dioxide or silicon nitride. In addition, the anode layer of the conductive layer can be reflective electrode layer. The cathode layer can be semi-transmissive metal layer. The material of the third insulation layer can be silicon dioxide or silicon nitride.

In the foregoing vertical pixel structures and the methods thereof, the self-light emitting device layer can be an organic light-emitting device layer. For example, the self-light emitting device layer can be constructed by an inverted-type OLED. The self-light emitting device layer can be a white light self-light emitting layer, or comprises self-light emitting layers with a plurality of primary colors. These primary colors, for example, can be red, green and blue.

In accordance with the foregoing vertical pixel structures and the methods thereof, a display with a higher aperture can be provided and the display can have an optimum energy saving. In addition, the display is suitable for displays of indoor and outdoor types. In addition, the manufacturing methods of the present invention are compatible with the processes of manufacturing TFT array, OLED and LCD without increasing costs. Moreover, since no wet processes are required, the yield can be increased.

BRIEF DESCRIPTION OF THE DRAWINGS

The features of the invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DESCRIPTION OF THE EMBODIMENTS

Technical features of the present invention will be further described in detail in accordance with the attached drawings. The concept of the present invention is to arrange a self-light emitting display unit and a reflective-type display unit vertically on a substrate.

Figure 1:
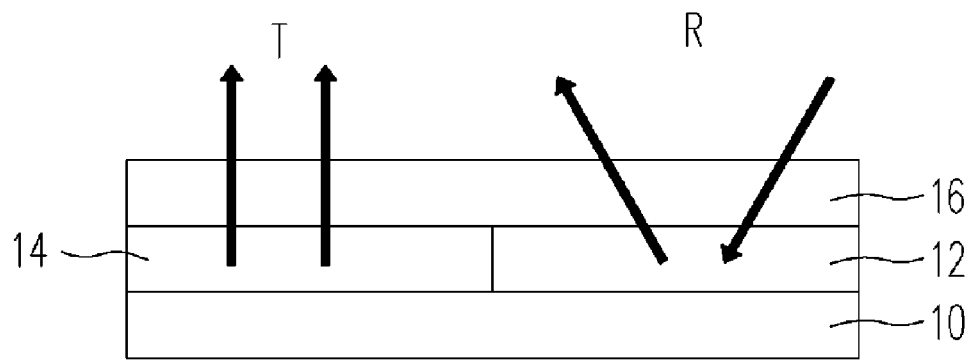
FIG. 1 is a schematic diagram of a conventional pixel structure.
Figure 2:
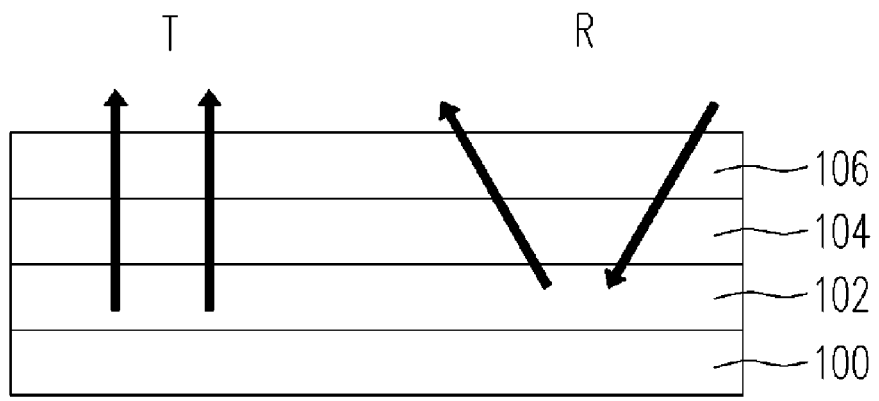
FIG. 2 is a schematic diagram of a pixel structure for an emi-flective display according to the present invention.

FIG. 2 is a schematic diagram showing a pixel structure for a vertical emissive-reflective (emi-flective) display according to the present invention. A single pixel is used as an example for detail description, but for a complete panel, there are same pixel structures on the substrate. In addition, the term "emi-flective" mentioned in the present invention relates to a pixel structure having s self-light emitting display unit and a reflective-type display unit.

As shown in FIG. 2, the pixel for the emi-flective display of the present invention is also established on a substrate 100. The substrate 100 is, for example, a flexible substrate. Furthermore, the substrate 100 can be a glass, plastic, silicon-based substrate, or metal foil substrate.

A self-light emitting pixel unit 102 is disposed on the substrate 100. The reflective pixel unit 104 is disposed on the self-light emitting pixel unit 100. A transparent cover layer 106 is disposed on the reflective pixel unit 104. Therefore, the pixel structure is clearly a vertical structure. The vertical structure described here relates to a stacking manner of the self-light emitting pixel unit 102 and the reflective pixel unit 104, rather than the conventional sideway horizontal arrangement. By arranging the self-light emitting pixel unit 102 below the reflective pixel unit 104, no backlight module has to be set for the reflective pixel unit 104.

In the aforementioned structure, the self-light emitting pixel unit 102 can be an active light emitting element, such as an organic light emitting diode (OLED). Any type of organic emitting element is suitable for the vertical pixel structure according to the present invention, such as an inverted-type OLED, but is not limited to this type. In addition, the aforementioned reflective-type pixel unit is, for example, made from liquid crystal. In practice, type of liquid crystal required is not restricted.

For those skilled in the art, whether the elf-light emitting pixel unit 102 and the reflective pixel unit 104 is lit or not, i.e., whether to write image data into the pixel is controlled through a switch circuit. According to the present invention, the switch circuit is not particularly limited to, and can be a transistor, for example.

In addition, in the aforementioned structure, an insulation layer (not shown) can further be disposed between the self-light emitting pixel unit 102 and the reflective pixel unit 104. The insulation layer is, for example, an insulation thin-film. Both the upper and the lower electrodes of the emitting pixel unit 102 are required to be patterned, and can independently control each pixel. Each self-light emitting pixel unit 102 is independently controlled by a pixel circuit, and each reflective pixel unit 104 is independently controlled by another pixel circuit.

As described above, each pixel layer contains only one particular display unit. Namely, at the same pixel layer, the panel area will be equally occupied by two different types of display units as the conventional horizontal structure. Since only one type (the self-light emitting pixel unit 102 or the reflective pixel unit 104) of display unit is formed on the entire panel area, one type of display units is operated at each display unit layer during the operation. Therefore, the pixel structure for the vertical emi-flective display of the present invention can provide a larger aperture. In other words, because each of the reflective region and the transmissive region of the above structure is on the same plane and are arranged up and down, the emitting area of the reflective region and the transmissive region can easily reach 50% or more. Therefore, the lower aperture ($\leq 30\%$) of the conventional horizontal pixel structure can be improved.

In addition, because the self-light emitting pixel unit is disposed below the reflective pixel unit, no additional backlight module is required. As a result, the conventional high power consumption can be solved.

Figure 3:
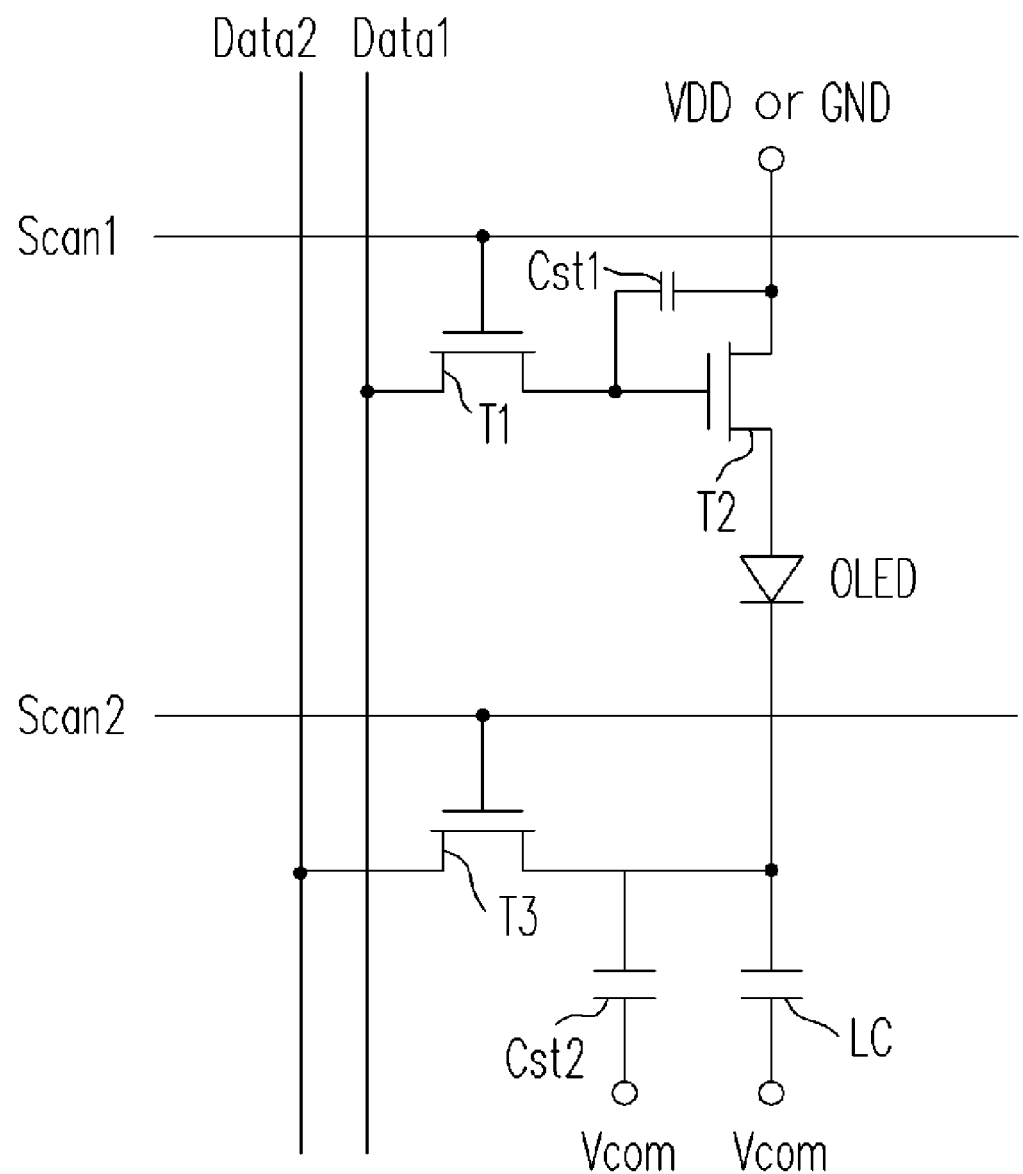
FIG. 3 is a schematic diagram of a single pixel structure for a vertical emi-flective display according to an embodiment of the invention.

FIG. 3 is a schematic diagram showing the vertical emi-reflective display according to an embodiment of the present invention. As shown in FIG. 3, the pixel structure for the vertical emi-flective display comprises a first transistor T1, a second transistor T2, a first storage capacitor Cst1, an self-light emitting display unit OLED, a third transistor T3, a second storage capacitor Cst2, and a reflective-type display unit LC. In addition, each pixel further includes two data lines Data1, Data2 and two scan lines Scan1, Scan2.

As shown in FIG. 3, the first transistor T1 has a gate, a source, and a drain, in which the gate and the source of the first transistor T1 are respectively coupled to the first scan line Scan1 and the first data line Data1. The second transistor T2 has a gate, a source, and a drain, in which the gate of the second transistor T2 is coupled to the source of the first transistor T1. The first storage capacitor Cst1 has one end coupled to the gate of the second transistor T2 and another end coupled to the source of the second transistor T2. Another end of the first storage capacitor Cst1 and the source of the second transistor T2 are coupled together to the operation voltage (power source) VDD. The self-light emitting display unit OLED has an anode, a self-light emitting layer (such as an organic light emitting layer) and a cathode, in which the anode is coupled to the drain of the second transistor T2. The third transistor T3 has a gate, a source, and a drain, in which the gate and the source of the third transistor T3 are respectively coupled to the second scan line Scan2 and the second data line Data2. The second storage capacitor Cst2 has one end coupled to the drain of the third transistor T3 and another end coupled to the common voltage Vcom. The reflective-type display unit LC has one end coupled to the drain of the third transistor T3 and the cathode of the organic emitting unit OLED, and another end coupled to the common voltage Vcom.

Through the aforementioned connection, the pixel structure for a vertical configuration as illustrated in FIG. 2 can be achieved. In operation, the reflective-type display unit is turned off during the self light emitting display mode, and the self-light emitting display unit is turned off during the reflective-type display mode.

As described above, the first, second, and third transistors T1, T2, T3 illustrated in FIG. 3 are equivalent to the switch element of the pixel. The transistors T1, T2, T3 can be, for example, thin-film transistors. Similarly, the thin-film transistor can be an organic TFT, a low-temperature polysilicon TFT, an amorphous TFT, a silicon-based TFT, a micro-silicon TFT (μ-Si-TFT), or a transparent TFT.

In the aforementioned structure, the self-light emitting pixel unit 102 can be an active light emitting element, such as an organic light emitting diode (OLED). Any type of organic emitting element is suitable for the vertical pixel structure according to the present invention, such as an inverted-type OLED, but is not limited to this type. In addition, the aforementioned reflective-type pixel unit is, for example, constructed by liquid crystal or EPD. In practice, type of liquid crystal required is not restricted.

Figure 4:
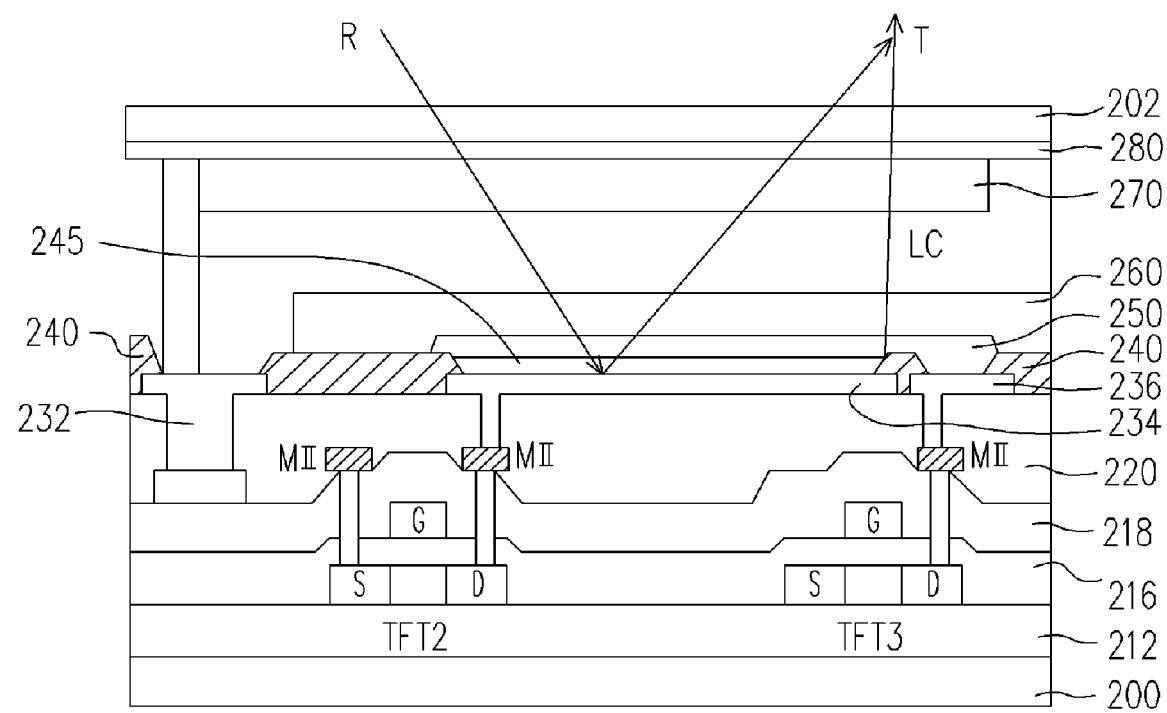
FIG. 4 is a schematic diagram of a pixel structure for a vertical emi-flective display according to an embodiment of the invention.

FIG. 4 is a schematic diagram showing a pixel structure for a vertical emi-flective display according to one embodiment of the present invention. FIG. 4 is a schematic cross-sectional view of FIG. 3 after the pixel structure is fabricated. The manufacturing method corresponding to the pixel structure shown in FIG. 4 will be described below.

Referring to FIG. 4, a switch layer is disposed on a first substrate 200. The first substrate 200 and a second substrate 202 (described below) can be flexible substrates. The first substrate 200 and the second substrate 202 can be glass substrates, metal foil substrates, plastic substrates or silicon-based substrates, etc. The switch layer comprises a first, a second and a third switch elements, each of which respectively comprises a channel region, a source region S and a drain region D. The first, the second and the third switch elements can be TFTs, for example organic TFTs, LTPS TFTs, amorphous silicon TFTs, silicon-based TFTs, microcrystalline silicon TFTs or transparent TFTs, etc. In FIG. 4, only the relatively important second and third switch elements TFT2, TFT3 are depicted, which are corresponding to the transistors T2 and T3 in FIG. 3. The first switch element corresponds to the transistor T1. Regarding the arrangement of the first switch element TFT1 (or the transistor T1), those skilled in this art may understand from FIG. 3.

The switch layer further comprises a buffer layer 212, a channel layer, a gate electrode layer, a gate oxide layer 216, an interlayer dielectric layer 218 and a plurality of source/drain electrodes. The buffer layer 212 is disposed on the first substrate 200, and the material of the buffer layer 212 can be silicon dioxide or silicon nitride, for example. The channel layer is disposed on the buffer layer 212 and further divided into channels for the first, the second and the third switch elements TFT1, TFT2 and TFT3. Each of the channels comprises a channel region, a source region S and a drain region D. The gate electrode layer has a plurality of gate electrodes G (the gate electrode layer is patterned into the gate electrodes G of the switch elements in the drawing). The gate electrode layer can be disposed either above or below the channel region, so as to form a top gate structure or a bottom gate structure. The gate oxide layer 216 is disposed between the gate electrode layer and the channel layer. The interlayer dielectric layer 218 is disposed between the channel layer and the gate electrode layer. The source/drain electrodes are disposed on the interlayer dielectric layer 218 and respectively electrically connected to the source regions S and the drain regions D of the first, the second and the third switch elements TFT1, TFT2 and TFT3.

A first dielectric layer 220 and a second dielectric layer 240 are located on the switch layer. The second dielectric layer 240 is disposed on the first dielectric layer 200 and a portion of the first dielectric layer 220 is exposed.

A conductive layer is disposed on the exposed first dielectric layer. The conductive layer is divided into a common electrode layer 232, an anode layer 234 and a cathode connecting layer 236. The anode layer 234 is electrically connected to a drain region D of the second switch element TFT2 through the first dielectric layer 220. The cathode connecting layer 236 is electrically connected to a drain region D of the third switch element TFT3 through the first dielectric layer 220. The anode layer 234 of the conductive layer can be a reflective electrode layer.

A self-light emitting device layer 245, serving as a self-light-emitting display unit, is disposed on the anode layer 234. The cathode layer 250 is disposed on the self-light emitting device layer 245 and electrically connected to the cathode connecting layer 236. The cathode layer 250 for example can be a semi-transmissive metal layer. The third dielectric layer 260 is disposed on the second dielectric layer 240 and the cathode layer 250, and exposes the common electrode layer 232. The material of the third dielectric layer 260 for example can be silicon dioxide or silicon nitride.

The above description relates to a structure of a self-light emitting display unit. According to the present invention, a structure of a reflective-type display unit is stacked on the self-light emitting display unit. A reflective-type display unit module layer is disposed on the third dielectric layer 260. The second substrate 202 is disposed on the reflective display unit module layer. Therefore, a pixel structure of a vertical self-light-emitting and semi-reflective display according to the invention is formed.

The aforementioned reflective-type display unit module layer for example can be a reflective-type liquid crystal module layer. As shown in FIG. 4, the reflective-type liquid crystal module layer may further comprises a liquid crystal layer LC disposed on the third dielectric layer 260; a color filter layer 270 disposed on the liquid crystal layer LC; and a transparent electrode layer 280 disposed between the second substrate 202 and the color filter layer 270. The transparent electrode layer 280 is further electrically connected to the common electrode layer 232.

The self-light emitting device layer 245 can be an OLED device layer, constructed by an inverted-type OLED layer, for example. The self-light emitting device layer 245 for example can be a white light self-light emitting device layer. Alternatively, the self-light emitting device layer 245 can comprises a plurality of primary color self-light emitting device layers. For example, the primary colors can be red, green and blue. When the above sub-pixel is applied to build a whole pixel structure, for example when three sub-pixels are applied to build a complete full-color pixel, the organic light-emitting device layer can use white-light organic light-emitting devices, while the colors of the pixels can be provided by using the color filter layer 270 of the liquid crystals. In addition, if the self-light emitting device layer uses red, green and blue self-light-emitting devices, the red, green and blue lights will be purer after passing through the color filter layer 270 of the liquid crystals.

Figure 5:
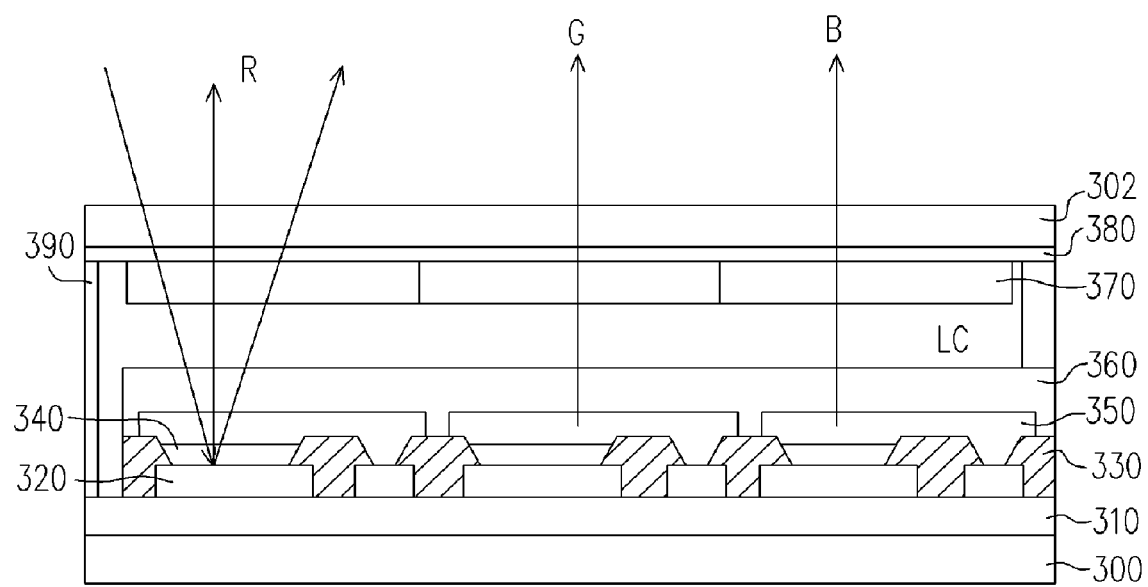
FIG. 5 is a schematic diagram of an all color pixel structure for a vertical emi-flective display according to an embodiment of the invention.

FIG. 5 is a schematic diagram of a full-color pixel structure for a vertical emi-flective display according to one embodiment of the present invention. The structure of FIG. 5 shows the full-color pixel structure having sub-pixels of FIG. 4 applied therein.

Referring to FIG. 5, the full-color pixel structure for a vertical emi-flective display comprises components arranged and formed between a first substrate 300 and a second substrate 302. A switch array layer 310 is disposed on the first substrate. In the switch array layer 310, each sub-pixel corresponding to one full-color pixel comprises a first, a second and a third switch elements (not shown, FIG. 4 can be referred). Each of the switch elements comprises a gate, a source and a drain.

Next, the structure of the self-light emitting device will be described in detail. The anode layer 320 is disposed on the switch array layer 310, and comprises a first, a second and a third anodes 320a, 320b, 320c, referring to FIG. 11. The first 320a, the second 320b and the third anodes 320a, 320b, 320c are respectively electrically connected to drains of second switch elements of the corresponding sub-pixels. The insulating layer 330 is disposed on the switch array layer 310 and the anode layer 320 for electrically isolating the first anode 320a, the second anode 320b and the third anode 320c from each other and for exposing the first anode 320a, the second anode 320b and the third anode 320c. A self-light emitting device layer 340 comprises a first self-light emitting device unit 340a, a second self-light emitting device unit 340b and a third self-light emitting device unit 340c, respectively disposed on the first anode 320a, the second anode 320b and the third anode 320c. A cathode layer 350 is disposed on the self-light emitting device layer 340 and the insulating layer 330. The cathode layer 350 comprises a first cathode 350a, a second cathode 350b and a third cathode 350c, respectively electrically connected to the drains of the third switch elements of corresponding sub-pixels. A passivation layer 360 is disposed on the cathode layer 350 for electrically isolating the first cathode 350a, the second cathode 350b and the third cathode 350c from each other.

The structure features of cathode layer 350 of the self-light emitting device according to the present invention can be understood from FIG. 5. The cathodes 350a, 350b, 350c as shown in FIG. 3 of the self-light-emitting device (OLED) according to the present invention are connected with the drain of the third transistor T3 (or TFT3 of FIG. 4) and the liquid crystal layer, while the cathodes of a conventional OLED are connected as a continuous cathode layer. In stead of the continuous cathode layer of the conventional OLED, the cathodes 350a, 350b, 350c of the present invention are discontinuously disposed as shown in FIG. 5.

Figure 16:
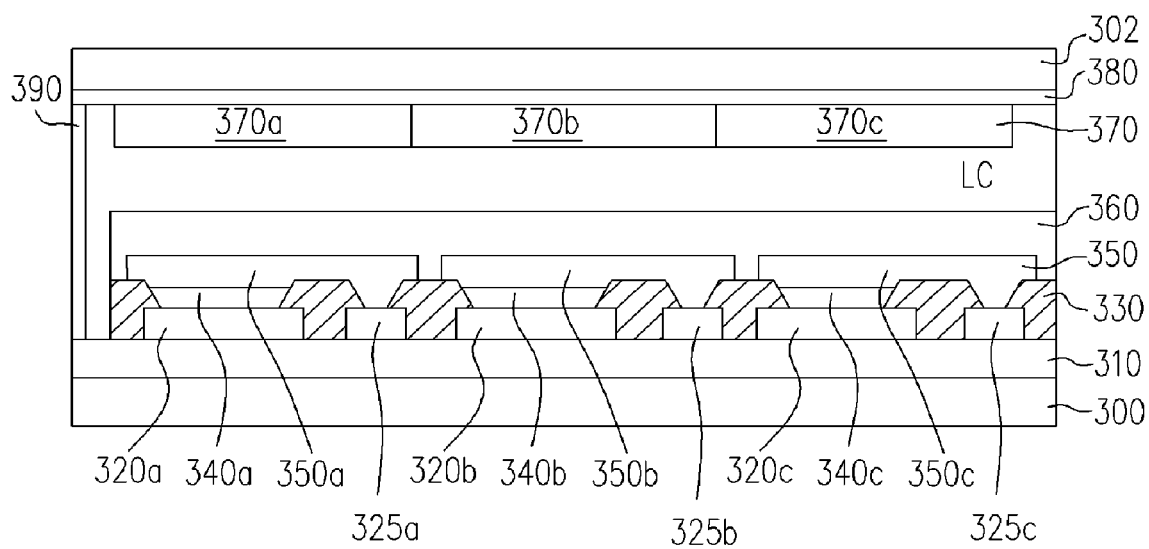

Then, a reflective display unit module layer is disposed on the passivation layer 360. The reflective display unit module layer for example is composed of reflective liquid crystal. The reflective display unit module layer basically comprises a liquid crystal layer LC, a color filter layer 370 and a transparent electrode 380. The liquid crystal layer LC is disposed on the passivation layer 360. The color filter layer 370 is disposed on the liquid crystal layer LC, and comprises a first color filter 370a, a second color filter 370b and a third color filter 370c as shown in FIG. 16, respectively aligned with the first self-light emitting device unit 320a, the second self-light emitting device unit 320b and the third self-light emitting unit 320c. The transparent electrode 380 is disposed between the color filter layer 370 and the second substrate 302, and electrically connected to the common electrode 390. Types of the transistors and materials of the substrates and the layers are similar with the examples corresponding to FIG. 4, and their descriptions are omitted.

The above organic light emitting device layer for example can use a white light organic light emitting device, while the emitted colors of the pixels can be provided by using the color filter layer 370 of the liquid crystal. In addition, if the self-light emitting device layer uses red, green and blue self-light-emitting devices, the emitted red, green and blue lights will be purer after passing through the color filter layer 370 of the liquid crystals.

Embodiments of method for manufacturing the foregoing pixel structure will now be described as follows. The embodiments are only brief examples, and those skilled in the art can modify the embodiment to fit their requirements. FIGS. 6 through 10 schematically shows processing diagrams of a method for manufacturing the pixel structure for the vertical emi-flective display according to one embodiment of the present invention.

Figure 6A:
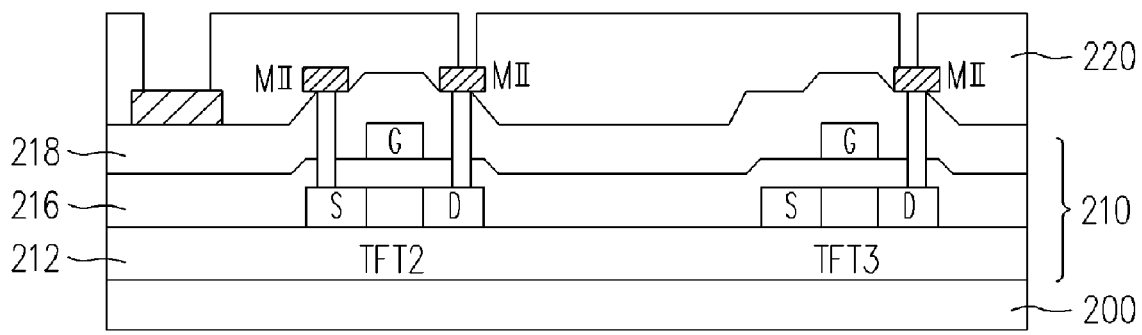
FIGS. 6 through 10 are flow schematic diagrams for illustrating the steps of a fabricating method for making a pixel structure for a vertical emi-flective display according to an embodiment of the invention.
Figure 6B:
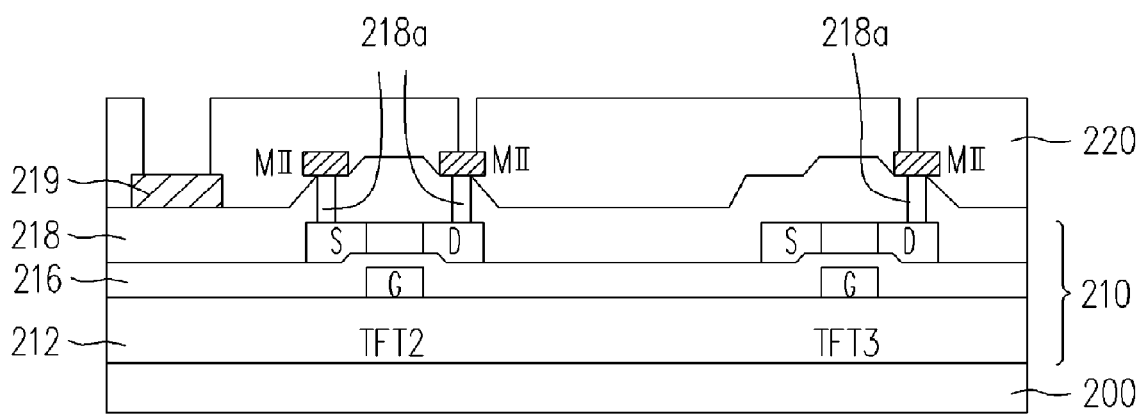
Figure 10:
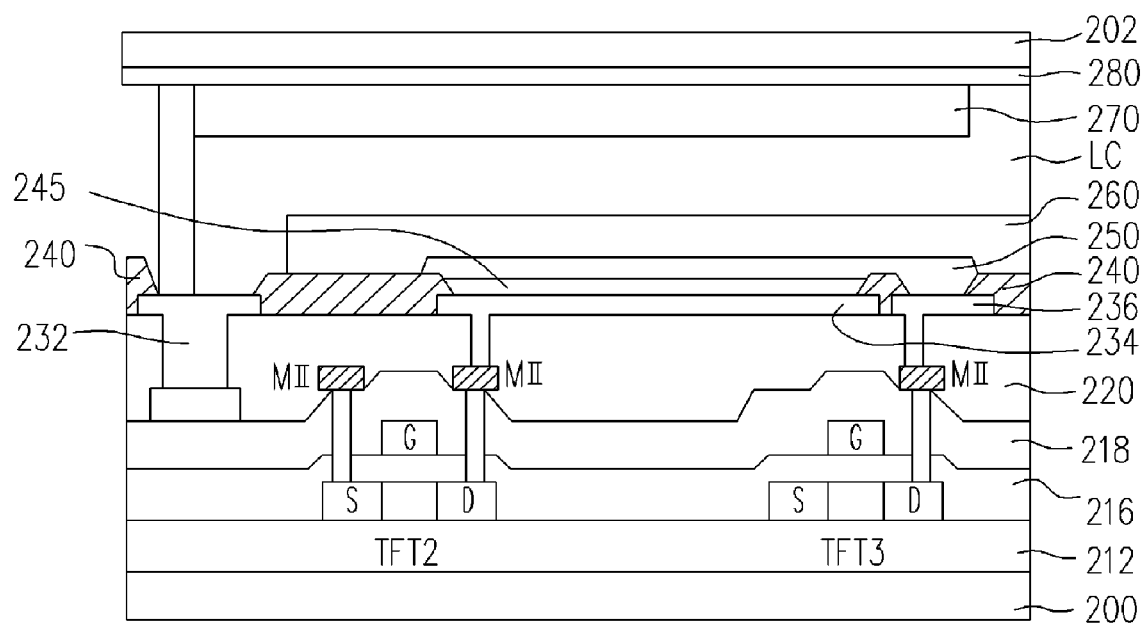

Referring to FIGS. 6A and 6B, a first substrate 200 and a second substrate 202 (as shown in FIG. 10) are first provided. The first substrate 200 and the second substrate 202 can be flexible substrates, for example. The first substrate 200 and the second substrate 202 for example can be glass substrates, metal foil substrates, plastic substrates or silicon-based substrates.

Then, a switch layer 210 is formed on the first substrate 200, and the switch layer 210 comprises a first, a second and a third switch elements, each of which comprises a source S, a drain D and a channel region (sandwiched between the source S and the drain D). In the drawings, only the switch elements TFT2 and TFT3 are depicted, which are respectively corresponding to the transistors T2 and T3 in FIG. 3. Although the transistor T1 is omitted in the drawing, those skilled in this art can understand how to arrange the transistor T1 and thus its description is omitted.

The detail structure of the switch layer 210 is further described. The transistors of the switch layer 210 can be a top gate structure in FIG. 6A or a bottom gate structure in FIG. 6B. For the top gate structure, the buffer layer 212 is first formed on the first substrate 200. The channel layer is then formed on the buffer layer 212, and the channel layer will be patterned to form channels of the first, the second switch and the third switch elements (only TFT2 and TFT2 are shown). Each switch element comprises a source S, a drain D and a channel region. A gate oxide layer 216 is then formed on the channel layer, and a gate electrode layer on the gate oxide layer that will be patterned to form a plurality of gate electrodes G. The gate electrodes G are respectively disposed over the channel regions, serving as the gates of the switch elements. An interlayer dielectric layer 218 is formed on the gate electrode layer and the gate oxide layer 216. Thereafter, a plurality of contact windows 218a is formed in the gate oxide layer 216 and the interlayer dielectric layer 218 to expose the sources S and drains D of the first, the second and the third switch elements (only TFT2 and TFT3 are shown). Metal material is then filled into the contact windows to form metal plugs. An electrode layer is further formed on the interlayer dielectric layer 218, and will be patterned to form a common electrode 219 and a plurality of source/drain electrodes M II that are automatically aligned with the metal plugs.

For the bottom gate structure shown in FIG. 6B, the buffer layer 212 is also first formed on the first substrate 200. The gate electrode layer is formed on the buffer layer 212 and patterned to form a plurality of gate electrodes G. The gate oxide layer 216 is formed on the buffer layer 212 and the gate electrodes G. The channel layer is then formed on the gate oxide layer 216, and patterned to form channels of the first, the second and the third switch elements, in which each switch element comprises a channel region, a source S and a drain D; forming an interlayer dielectric layer 218 on the channel layer and the gate oxidation layer 216. A plurality of contact windows 218a is formed in the interlayer dielectric layer 218 for exposing the underneath sources S and drains D of the first, the second and the third switch elements. Metal material is filled into the contact windows 218a to form metal plugs. An electrode layer is further formed on the interlayer dielectric layer 218, and will be patterned to form a common electrode 219 and a plurality of source/drain electrodes M II that are automatically aligned with the metal plugs.

Figure 7:
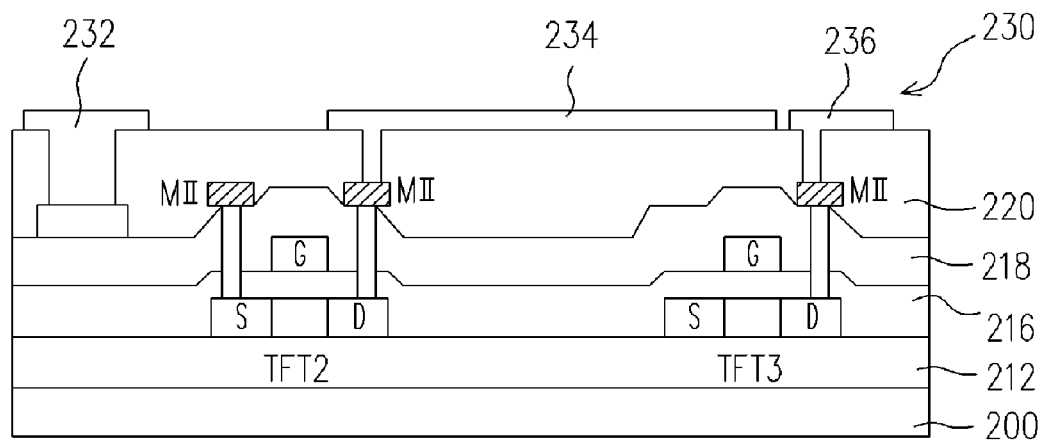

The material of the aforementioned buffer layer for example can be silicon dioxide or silicon nitride. As shown in FIGS. 6A and 6B, a first insulating layer 220 is formed on the switch layer 210. Contact windows are further formed in the first insulating layer 220 at the positions corresponding to the common electrode 219, the source/drain electrode MII. As shown in FIG. 7, a conductive layer is formed on the first insulating layer 220, and the conductive layer is patterned to expose a portion of the first insulating layer 220. The remaining conductive layers respectively serve as a common electrode layer 232, an anode layer 234 and a cathode connecting layer 236. The anode layer 234 can be constructed by a reflective electrode layer, for example.

Figure 8:
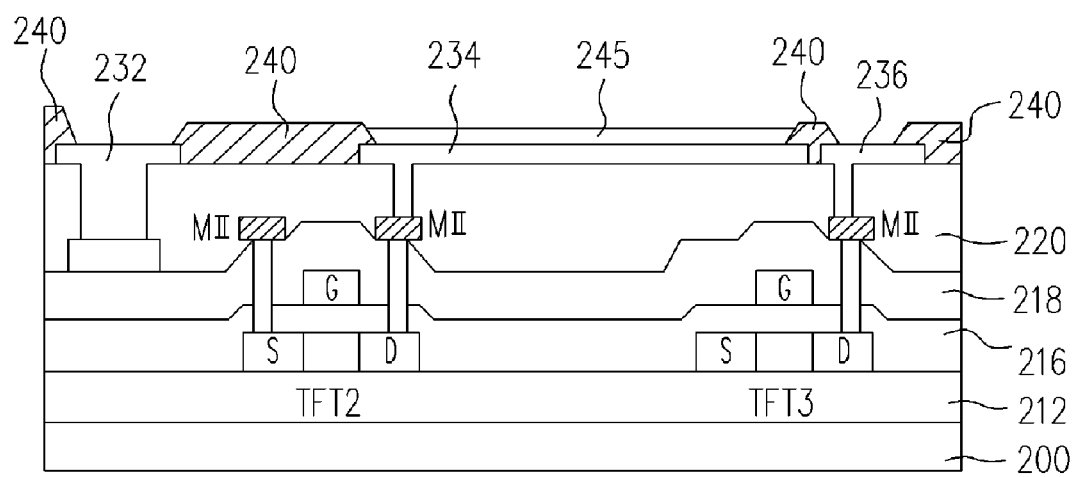

As shown in FIG. 8, a second insulating layer 240 is formed on the exposed first insulating layer 220. A self-light emitting device layer 245 is further formed on the anode layer 234. The self-light emitting device layer 245 can be an organic light emitting device layer, for example constructed by an inverted-type OLED. The self-light emitting device layer can be a white light self-emitting device layer, or consist of a plurality of primary color self-emitting devices, for example red, green and blue OLEDs.

Figure 9:
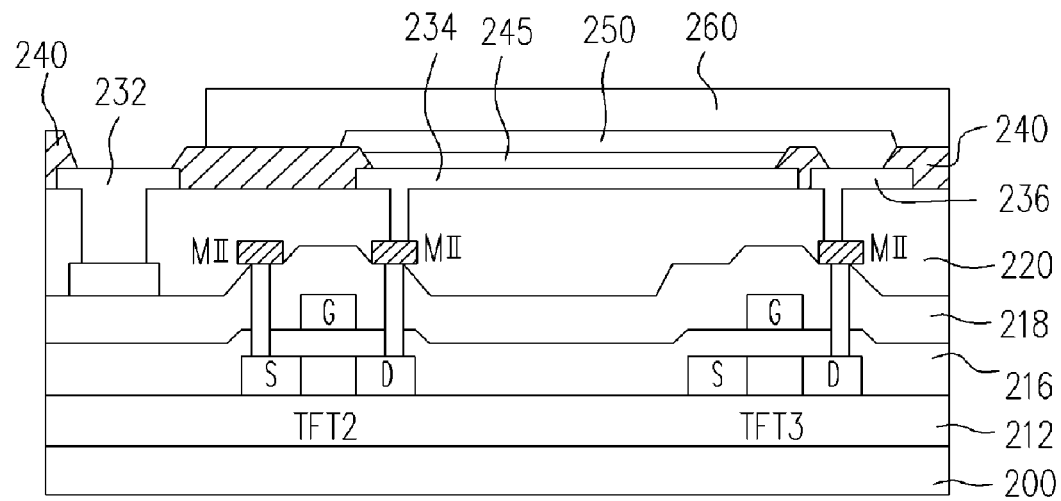

In FIG. 9, a cathode layer 250 is formed on the self-light emitting device layer 245 and the cathode connecting layer 236, so that the cathode layer 250 is electrically connected to cathode connecting layer 236. The cathode layer 250 for example can be a semi-transmissive metal layer. In this way, the cathode (the cathode layer 250) of the self-light emitting device layer 245 is connected to the drain D of the transistor TFT3. A third insulating layer 260 is further formed on the second insulating layer 240 and the cathode layer 250, and exposes the common electrode layer 232. The self-light emitting display unit of the pixel structure in FIG. 3 is complete. The material of the third insulating layer for example can be silicon dioxide or silicon nitride.

In FIG. 10, a reflective display unit module layer is formed on the second substrate 202, and the reflective display unit module layer with the second substrate is then disposed on the third insulating layer 260. The reflective display unit module layer can be composed of reflective-type liquid crystal. The reflective display unit module layer comprises a liquid crystal layer LC, a color filter layer 270 and a transparent electrode layer 280. The transparent electrode layer 280 is formed between the second substrate 202 and the color filter layer 270 and electrically connected to the common electrode layer 232. The method for forming the liquid crystal display device can use any existent method, not restricted to a specific method.

The method for manufacturing the full-color pixel structure in FIG. 5 is described as follows. FIGS. 11 to 16 schematically show processing diagrams for manufacturing the all color pixel structure for a vertical emi-flective display.

Figure 11:
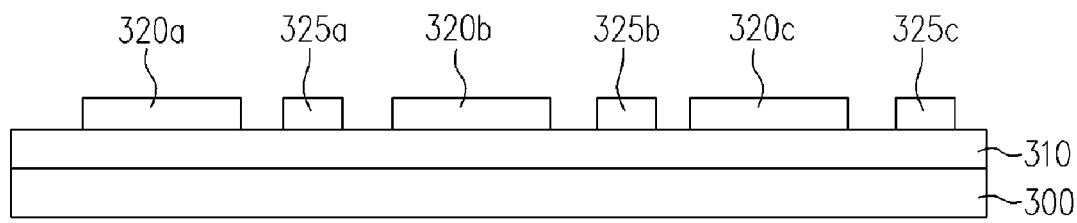
FIGS. 11 through 16 are flow schematic diagrams for illustrating the steps of a fabricating method for making an all color pixel structure for a vertical emi-flective display according to an embodiment of the invention.

In FIG. 11, a first substrate 300 is provided. The first substrate 300 can be a flexible substrate, such as a glass substrate, a plastic substrate, a silicon-based substrate or a metal foil substrate.

A switch array layer 310 is formed on the first substrate 300. Each sub-pixel of its corresponding full-color pixel comprises a first, a second and a third switch elements, and each of the first, the second and the third switch elements comprises a gate, a source and a drain. The detailed structure and manufacturing method of the sub-pixels can be referred to FIGS. 4 and 6 through 10. Thereafter, an anode layer is formed on the switch array layer 310, and then patterned into a first, a second, and a third anodes 320a, 320b, 320c which are respectively electrically connected to drains of the corresponding second switch elements. The anode layer can be a reflective electrode layer. Furthermore, a portion of conductive layers 325a, 325b, 325c is used for connecting cathodes and the transistors of the switch array.

Figure 12:
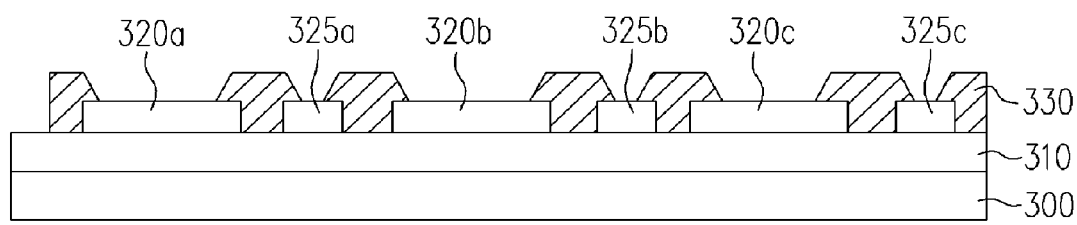

In FIG. 12, an insulating layer 330 is formed on the switch array layer 310 and the anode layer composed of anodes 320a, 320b, 320c, for electrically isolating the first anode 320a, the second anode 320b and the third anode 320c from each other and for exposing the first anode 320a, the second anode 320b and the third anode 320c.

Figure 13:
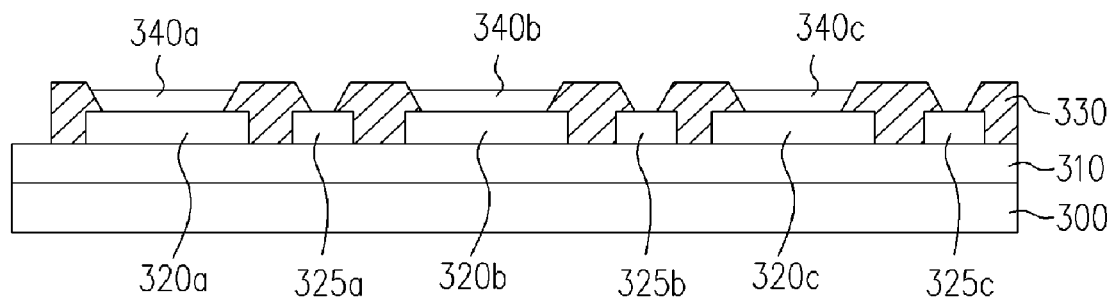

In FIG. 13, a self-light-emitting device layer is formed in a manner that the self-light emitting device layer comprises a first self-light emitting device unit 340a, a second self-light emitting device unit 340b and a third self-light emitting device unit 340c, respectively disposed on the first anode 320a, the second anode 320b and the third anode 320c. The self-light emitting device layer can be an organic light emitting device layer, for example constructed by an inverted-type OLED. The self-light emitting device layer can be a white light self-emitting device layer, or consist of a plurality of primary color self-emitting devices, for example red, green and blue OLEDs.

Figure 14:
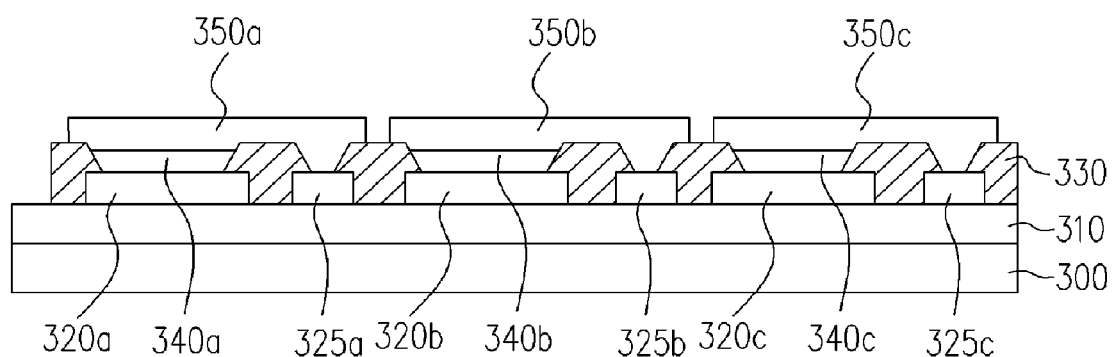
Figure 15:
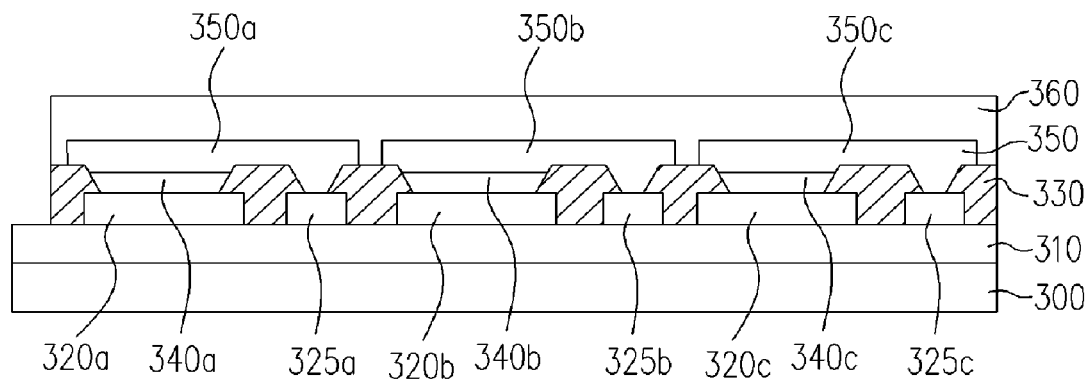

In FIG. 14, a cathode layer 350 is formed on the self-light emitting device layer and the insulating layer 330, and patterned to form a first cathode 350a, a second cathode 350b and the third cathode 350c. The first cathode 350a, the second cathode 350b and the third cathode 350c are respectively electrically connected to drains of the corresponding third switch elements through the conductive layers 325a, 325b, 325c (equivalent to the cathode connecting layer 240 in FIG. 4). The cathode layer for example can be a semi-transmissive metal layer. In FIG. 15, a passivation layer 360 is formed on the cathode layer 350 to electrically isolate the cathodes 350a, 350b, 350c. The material of the passivation layer 360 can be silicon dioxide or silicon nitride, for example.

In FIG. 16, a liquid crystal layer LC is formed on the passivation layer 360, and a color filter layer 370 is formed on the liquid crystal layer LC. The color filter layer 370 further comprises a first color filter 370a, a second color filter 370b and a third color filter 370c, respectively formed at positions aligned with the first self-light emitting device unit 340a, the second self-light emitting device unit 340b and the third self-light-emitting unit 340c. The first color filter 370a, the second color filter 370b and the third color filter 370c respectively correspond to the red light, the green light and the blue light filters.

Thereafter, a transparent electrode 380 is formed on the color filter layer 370 and electrically connected to the common electrode 390. Then, a second substrate 302 is formed on the transparent electrode 380.

In summary, according to the aforementioned vertical pixel structure and method for making the same, a display with a higher aperture can be provided and the display can have an optimum energy saving. In addition, the display is suitable for displays of indoor and outdoor types. In addition, the manufacturing methods of the present invention are compatible with the processes of manufacturing TFT array, OLED and LCD without increasing costs. Moreover, since no wet processes are required, the yield can be increased.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. A method for manufacturing a pixel structure for a vertical emi-flective display, comprising:
   providing a first substrate and a second substrate;
   forming a switch layer on the first substrate, wherein the switch layer comprises a first, a second and a third switch elements, and each of the switch elements comprises a channel region, a source and a drain;
   forming a first insulating layer on the switch layer;
   forming a conductive layer on the first insulating layer, and patterning the conductive layer to expose a portion of the first insulating layer, wherein the remaining conductive layer respectively serves as a common electrode layer, an anode layer and a cathode connecting layer;
   forming a second insulating layer on the exposed portion of the first insulating layer;
   forming a self-light emitting device layer on the anode layer;
   forming a cathode layer on the self-light-emitting device layer and the cathode connecting layer, wherein the cathode layer is electrically connected to the cathode connecting layer;
   forming a third insulating layer on the second insulating layer and the cathode layer such a way wherein a top surface of the common electrode layer being exposed by the third insulating layer; and
   forming a reflective-type display unit module layer on the second substrate, and disposing the reflective-type display unit module layer with the second substrate onto the third insulating layer.

2. The method of claim 1, wherein step of forming the switch layer further comprises:
   forming a buffer layer on the first substrate;
   forming a channel layer on the buffer layer, and patterning the channel layer into channels of the first, the second and the third switch elements, wherein each of the channels has the channel region, the source and the drain;
   forming a gate oxide layer on the channel layer;
   forming a gate electrode layer on the gate oxide layer, and patterning the gate electrode layer into a plurality of gate electrodes, wherein the gate electrodes are respectively formed above the channel regions;
   forming an interlayer dielectric layer on the gate electrode layer and the gate oxide layer;
   forming a plurality of contact windows within the gate oxide layer and the interlayer dielectric layer to expose the sources and drains of the first, the second and the third switch elements, and forming metal plugs in the contact windows; and
   forming an electrode layer on the interlayer dielectric layer, and patterning the electrode layer to form a common electrode and a plurality of source/drain electrodes that are automatically aligned with the metal plugs.

3. The method of claim 1, wherein step of forming the switch layer further comprises:
   forming a buffer layer on the first substrate;
   forming a gate electrode layer on the buffer layer, and patterning the gate electrode layer to form a plurality of gate electrodes;
   forming a gate oxide layer on the buffer layer and the gate electrodes;
   forming a channel layer on the gate oxide layer, and patterning the channel layer to form channels of the first, the second and a third switch elements, wherein each of the switch elements has the channel region, the source and the drain;
   forming an interlayer dielectric layer on the channel layer and the gate oxide layer;
   forming a plurality of contact windows within the interlayer dielectric layer to expose the sources and drains of the first, the second and the third switch elements, and forming metal plugs in the contact windows;
   forming an electrode layer on the interlayer dielectric layer, and patterning the electrode layer to form a common electrode and a plurality of source/drain electrodes, that are automatically aligned with the metal plugs.

4. The method of claim 1, wherein step of forming the conductive layer further comprises:
   patterning the first insulating layer to form a plurality of contact windows, so as to expose the common electrode and the source/drain electrodes corresponding to the drains of the second and the third switch elements; and
   forming the conductive layer on the first insulating layer, and electrically connecting with the common electrode and the source/drain electrodes corresponding to the drains of the second and the third switch elements.

5. The method of claim 1, wherein the first, the second and the third switch elements are selected form a group consisting of organic TFTs, low temperature polysilicon (LTPS) TFTs, amorphous silicon TFTs, silicon-based TFTs, microcrystalline silicon TFTs and transparent TFTs.

6. The method of claim 1, wherein the first substrate and second substrate are flexible substrates.

7. The method of claim 1, wherein the first and the second substrates are selected from a group consisting of glass substrates, metal foil substrates, plastic substrates or silicon-based substrates.

8. The method of claim 2, wherein the buffer layer is made of silicon dioxide or silicon nitride.

9. The method of claim 3, wherein the buffer layer is made of silicon dioxide or silicon nitride.

10. The method of claim 1, wherein the anode layer of the conductive layer is a reflective electrode layer.

11. The method of claim 1, wherein the cathode layer is a semi-transmissive metal layer.

12. The method of claim 1, wherein a material of the third insulating layer is silicon dioxide or silicon nitride.

13. The method of claim 1, wherein the self-light emitting device layer is an organic light emitting device layer.

14. The method of claim 13, wherein the self-light emitting device layer is constructed by an inverted-type OLED.

15. The method of claim 1, wherein the self-light emitting device layer is a white light self-light emitting layer.

16. The method of claim 1, wherein the self-light emitting device layer is constructed by self-light emitting layers with a plurality of primary colors.

17. The method of claim 16, wherein the primary colors are red, green and blue.

18. A method for manufacturing a full-color pixel structure for a vertical emi-flective display, comprising:
   providing a first substrate;
   forming a switch array layer on the first substrate, wherein each sub-pixel corresponding to the full-color pixel comprises a first, a second and a third switch elements, and each switch element has a gate, a source and a drain;
   forming an anode layer on the switch array layer, and patterning the anode layer into a first anode, a second anode and a third anode, wherein the first anode, the second anode and the third anode are respectively electrically connected to the drains of the corresponding second switch elements;
   forming an insulating layer on the switch array layer and the anode layer for electrically isolating the first anode, the second anode and the third anode from each other and exposing the first anode, the second anode and the third anode and;

forming a self-light emitting device layer, wherein the self-light emitting device layer comprises a first self-light emitting device unit, a second self-light emitting device unit and a third self-light-emitting device respectively disposed on the first anode, the second anode and the third anode;

forming a cathode layer on the self-light emitting device layer and the insulating layer, and patterning the cathode layer to form a first cathode, a second cathode and a third cathode which are electrically connected to drains of corresponding third switch elements;

forming a passivation layer on the cathode layer for electrically isolating the first cathode, the second cathode and the third cathode from each other;

forming a liquid crystal layer on the passivation layer;

forming a color filter layer on the liquid crystal layer, wherein the color filter layer comprises a first color filter, a second color filter and a third color filter respectively aligned with the first self-light emitting device unit, the second self-light emitting device unit and the third self-light emitting device unit;

forming transparent electrode on the color filter layer, wherein the transparent electrode is electrically connected to a common electrode; and forming a second substrate disposed on the transparent electrode.

19. The method of claim 18, wherein the first, the second and the third are selected form a group consisting of organic TFTs, low temperature polysilicon (LTPS) TFTs, amorphous silicon TFTs, silicon-based TFTs, microcrystalline silicon TFTs and transparent TFTs.

20. The fabricating method for an all color pixel structure for a vertical emi-flective display according to claim 18, wherein the first substrate and second substrate are flexible substrates.

21. The method of claim 18, wherein the first and the second substrates are selected from a group consisting of glass substrates, metal foil substrates, plastic substrates or silicon-based substrates.

22. The method of claim 18, wherein the anode layer is a reflective electrode layer.

23. The method of claim 18, wherein the cathode layer is a semi-transmissive metal layer.

24. The method of claim 18, wherein a material of the passivation layer is silicon dioxide or silicon nitride.

25. The method of claim 18, wherein the self-light emitting device layer is an organic light-emitting device unit layer.

26. The method of claim 18, wherein the self-light emitting device layer is constructed by an inverted-type OLED.

27. The method of claim 18, wherein the self-light emitting device layer is a white light self-light emitting layer.

28. The method of claim 18, wherein the self-light emitting device layer is constructed by self-light emitting layers with a plurality of primary colors.

29. The method of claim 28, wherein the primary colors are red, green and blue.

30. The method of claim 18, wherein the first color filters, the second color filters and the third color filter respectively correspond to red light, green light and blue light.

* * * * *